United States Patent

Hajmrle et al.

[19]

[11] Patent Number: 5,935,406
[45] Date of Patent: Aug. 10, 1999

[54] PROCESS FOR MANUFACTURE OF UNIFORMLY SIZED METAL SPHERES

[75] Inventors: Karel Hajmrle; Kenneth G. Reid, both of Fort Saskatchewan, Canada

[73] Assignee: ThermicEdge Corporation, Edmonton, Canada

[21] Appl. No.: 08/930,578

[22] PCT Filed: Apr. 19, 1996

[86] PCT No.: PCT/CA96/00254

§ 371 Date: Oct. 17, 1997

§ 102(e) Date: Oct. 17, 1997

[87] PCT Pub. No.: WO96/33299

PCT Pub. Date: Oct. 24, 1996

[30] Foreign Application Priority Data

Apr. 20, 1995 [GB] United Kingdom ............... 9508087

[51] Int. Cl.⁶ ............... C25D 7/00; C25D 5/34; C25D 5/52
[52] U.S. Cl. ............... 205/149; 205/206; 205/222
[58] Field of Search ............... 205/50, 149, 206, 205/222; 428/403, 570

[56] References Cited

U.S. PATENT DOCUMENTS 4,908,106  3/1990  Takeshima et al. ............... 204/23
4,943,355  7/1990  Patterson ............... 204/20

FOREIGN PATENT DOCUMENTS 1529303  10/1978  United Kingdom .

*Primary Examiner*—Kathryn Gorgos
*Assistant Examiner*—Edna Wong
*Attorney, Agent, or Firm*—Arne I. Fors

[57] ABSTRACT

An improved process for the manufacture of uniformly and accurately sized metal spheres, particularly copper spheres, which comprises the steps of classifying a starting lot of spheres into closely sized fractions; separately electroplating each size fraction to a desired final mean diameter and size distribution; and then combining the plated fractions to give a metal sphere product having the requisite mean particles size and size distribution. The electroplating build-up step is characterized by a high level of precision. Additional benefits derive from the high hardness of copper electroplate on relatively soft copper starting particles which facilitates grinding or polishing irregularly shaped plated particles down to the desired sphericity and mean diameter, from the ability of metal such as copper electroplate to cover and envelop contaminated surfaces of starting particles, and from the ability to produce spheres having a unique combination of bulk and surface properties.

7 Claims, 7 Drawing Sheets

FIG 3.B.

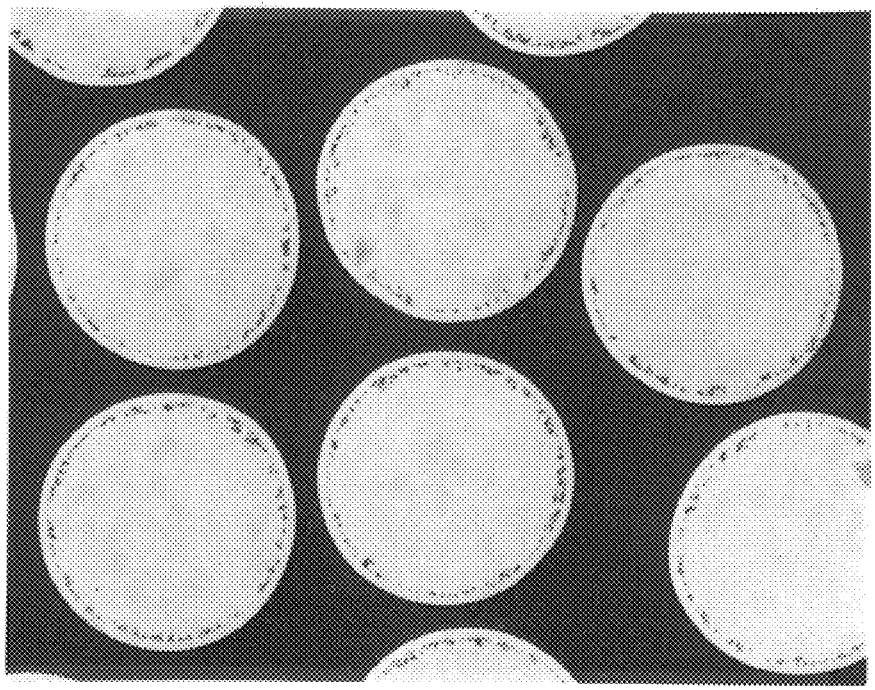
FIG.7A. Mag.50x.
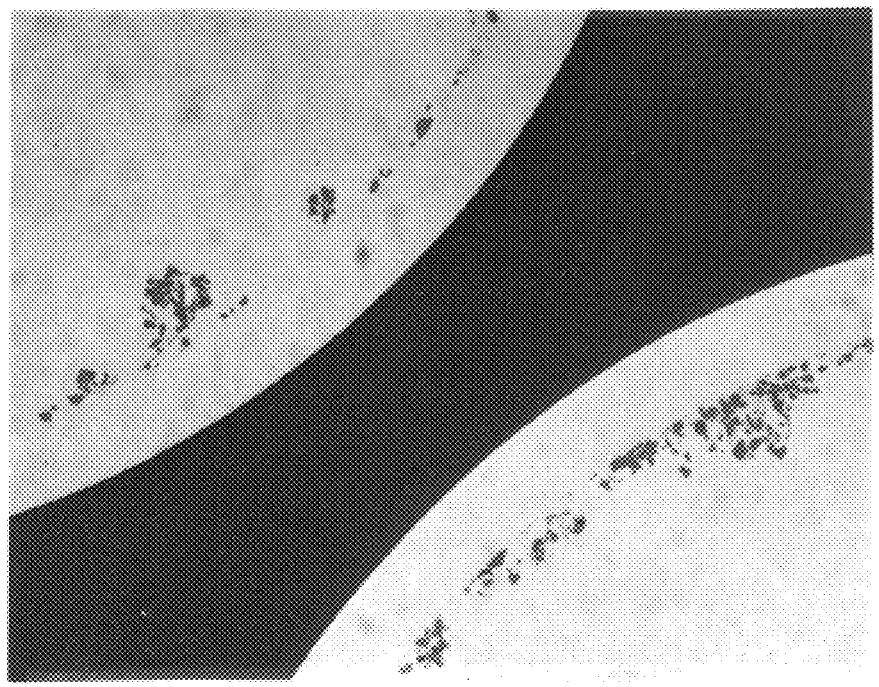
FIG.7B. Mag.400x.

PROCESS FOR MANUFACTURE OF UNIFORMLY SIZED METAL SPHERES

This application is the national phase of international application PCT/CA96/00254 filed Apr. 19, 1996 which was designated the U.S.

FIELD OF THE INVENTION

This invention relates to a method for the manufacture of spherical metal particles and, more particularly, relates to a method of manufacturing uniformly and accurately sized metal spheres, having a high level of sphericity.

BACKGROUND OF THE INVENTION

Copper spheres and to a lesser degree spheres of other metals are an increasingly important intermediary product in the electronic circuit board industry. In particular, they are used in the emerging technology of ball grid arrays where devices are attached to circuit boards by the use of solder balls. For instance, in order to improve thermal and electrical conductivity, new developments make use of spheres comprising pure copper spheres coated with solder, typically a 63% tin 37% lead solder composition. Also, pluggable ball grid arrays are known in which devices having metal balls attached thereto can be plugged into sockets by application of pressure. Copper spheres with hard surfaces are well suited for this application since the hard surfaces are resistant to the rubbing contact of socket springs. Demonstrated techniques for making copper spheres include gas atomization of a stream of molten copper, vibration of molten copper through a multiple orifice die, and grinding and polishing of chopped wire.

Two key requirements for spheres used in applications such as ball grid arrays are that they be uniformly sized and almost perfectly spherical to ensure consistency of contact between the various connecting points on an electronic device and the circuit board to which it is attached. A typical sphere diameter requirement such as 712±25 micrometers is difficult if not impossible to achieve directly by any of the aforementioned production processes. Gas atomization produces a wide sphere size distribution yielding a low recovery. The multiple orifice die vibration technique also produces wider than required sphere size distribution which is very difficult to centre on the narrow size interval required. This leads to low sphere recovery in the required interval of particle sizes.

Product sphericity, which is the average ratio of sphere maximum diameter (Dmax) relative to sphere minimum diameter (Dmin) must be less than 1.05, i.e. the difference between Dmax and Dmin must be less than 5% for electronic applications.

Grinding and polishing of chopped wire to produce spheres of desired sphericity not only is substantially more expensive than the above-mentioned two techniques but also it is very difficult to accomplish because of the softness of metal particles such as copper particles. Also, the particle softness leads to heavy surface contamination from the grinding and polishing media, rendering the product unusable for electronic applications.

It should be understood that the sphericity of the final product can be achieved only if the spheres before electroplating are very close to the sphericity of the required final product. That is to say, electroplating cannot substantially change the particle sphericity. If nonspherical starting material is used, it has to be made spherical either before or after electroplating by such techniques as grinding or polishing.

It is a principal object of the present invention to provide a method for producing uniformly sized metal spheres which when coated with solder or used without a solder coating will meet the requirements of electronic connective applications such as use in ball grid arrays. It will be understood that although the description of the invention will proceed with reference to the coating of core spheres or like particles by copper electroplating, the technology disclosed in this application could be based on various other techniques for coating the core spheres in addition to electroplating such as electroless plating, mechanical plating, physical vapor deposition and chemical vapor deposition with metals other than copper. It will also be understood that the term "metal" used herein will include both metals and metal alloys.

It is a further object of the invention to produce radially differentiated, composite metal spheres of a uniform size that have a hardened surface to improve their utility, such as for use in ball grid arrays, and have an acceptable high level of sphericity. The invention is not limited to the production of spheres with a hardened surface, and may include spheres with a unique combination of bulk and surface properties achieved by the processes described herein.

SUMMARY OF THE INVENTION

With commercially available metal spheres having wide particle size distribution as a starting point, the method of the invention in its broad aspect comprises the steps of classifying the starting spheres into discrete, tightly sized fractions and then separately subjecting each fraction to a metal electroplating process that builds up the particles to the required mean size and size distribution, the latter being determined by the tightness or narrow fraction size range in which the starting spheres are classified.

In the case where starting metal spheres have an acceptable size distribution range but an unacceptable mean size then, according to this invention, electroplating with metal increases the mean size to the required size level. It is possible to achieve essentially the same cladding thickness of electroplate on all particles.

The described method can provide extremely tight control of the average sphere diameter. An average sphere diameter of a batch of copper spheres produced by the method of the invention has the potential of control of final average sphere size to within ±2 micrometers. For a 712 micrometer sphere this means a size deviation of only ±0.3%.

A high level of product sphericity is attainable. For example, the average Dmax to Dmin ratio for a batch of copper spheres produced according to the method of the invention typically is between 1.02 and 1.03, i.e. the average difference between the maximum and minimum sphere diameter is only 2 to 3%.

Another advantage of the invention when the starting particles contain irregularly shaped particles, is that each of the various size fractions from the classification can be copper electroplated oversize and subsequently polished, i.e. ground, down to the required mean size with almost perfect sphericity. The polishing step is made easier by virtue of the inherently high hardness of the electroplated copper coating compared to the original softness of the starting particles.

A further advantage of the invention is that in the case where the starting particles have contaminated surfaces, as may occur when soft spheres have been ground to shape using grinding media of another material, the copper electroplating step will envelop the contaminated surface, rendering it harmless.

A further benefit of the invention is that substantially more material than the original input into the process is produced. If, for instance, 1 kg. of copper spheres having average diameter of 500 micrometers is built to an average diameter size of 712 micrometers, then 2.9 kg. of composite product is produced from the original starting lot of 1 kg.

The spheres of the finished product have a unique combination of bulk and surface properties. In the case of copper cladding on copper core, the copper cladding tensile strength can be changed by the bath chemistry or electroplating conditions from 5000 PSI to 90,000 PSI, elongation from 0% to 41%, hardness Vickers Hardness Number of 200 ($VHN_{200}$) from 48 to 350 kg/sq.mm, and electrical resistivity from 1.7 to 4.6 microhm-cm. The grain structure of the electrodeposited copper can be columnar, fibrous, equiaxed or banded. The coating surface can be mirror bright or matte.

In a preferred embodiment, the method of the invention for the manufacture of accurately sized metal spheres having a high level of sphericity comprises the steps of classifying starting metal particles having a wide diameter size range distribution into different narrow diameter size range fractions, and separately electroplating each different size range fraction smaller than a desired final mean diameter with a metal or metal alloy such that each electroplated fraction has approximately the same final mean diameter and diameter distribution. The electroplated fractions preferably are combined to give a product with the required final mean diameter and diameter distribution.

In accordance with another embodiment of the method of the invention, wherein one or more of the classified size fractions of the starting metal particles contains particles with an irregular shape, said one or more size fractions is electroplated to an oversize diameter, and the oversize particles polished after electroplating down to the desired final mean diameter to yield the desired degree of sphericity, the final mean diameter and the diameter distribution.

In accordance with a still further embodiment of the invention, wherein one or more of the classified fractions of the starting metal particles contain particles with contaminated surfaces, said particles are electroplated with a compatible metal or metal alloy to envelop said contaminated surfaces and to provide product metal spheres having uncontaminated surfaces.

BRIEF DESCRIPTION OF THE DRAWINGS

The method of the invention will now be described with reference to the accompanying drawings, in which:

FIGS. 3A–3C are schematic representations of the production of copper spheres according to the method of the present invention: FIG. 3A showing an irregular soft copper particle before electroplating, FIG. 3B showing the copper particle of FIG. 3A with hard electroplated copper, and FIG. 3C showing the electroplated particle of FIG. 3B after grinding;

FIG. 6A showing a ground sphere with surface contamination and FIG. 6B showing the sphere of FIG. 6A with an uncontaminated electroplated layer; and FIGS. 7A and 7B are photographs of grinding grit contamination at the interface between unetched copper spheres produced by grinding and polishing soft, atomized copper particles and the hard electroplated copper layer (magnification is 50× for FIG. 7A and 400× for FIG. 7B).

DESCRIPTION OF THE PREFERRED EMBODIMENT

Figure 1:
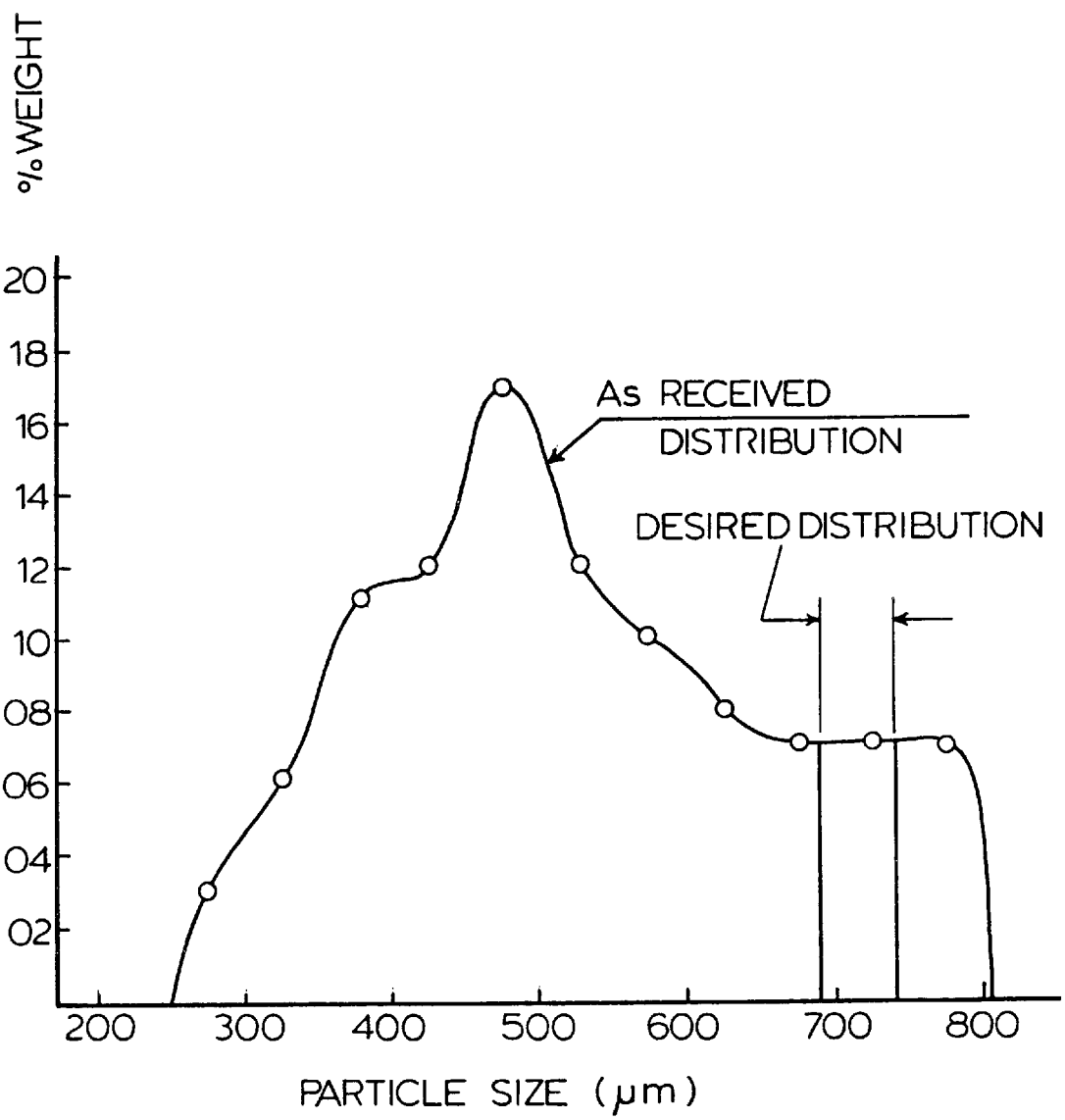
FIG. 1 is a graph illustrating as-received size distribution of particles in a batch of copper spheres produced by vibration of molten copper through a multiple orifice die.

With reference to FIG. 1, the sphere size distribution curve of a typical copper sphere batch produced by vibration of a molten metal bath through a multiple orifice die is shown. Only about 7% of the material is in the desired particle size range of, for example, 712±25 micrometers. The total weight of the whole batch was 317 grams and the weight of the useful product was only 22 grams. Accordingly, 93% of the original batch material could not be used.

Embodiments of the method of the invention for manufacturing uniformly sized copper spheres from (i) a a batch of undersized copper spheres produced by molten metal atomization and classified into narrow size range by screening, followed by electroplating, (ii) from a batch of irregular, soft copper spheres electroplated with a layer of hard copper, and then ground down to a desired size range, and (iii) grinding soft copper spheres to a size range smaller than desired and then electroplating the sphere to build the spheres size up to the final desired range and to cover surface contamination, will now be described in the following non-limitative examples.

EXAMPLE 1

Soft copper spheres produced by vibration of a molten metal bath through a multiple orifice die and having the size distribution shown in FIG. 1 were classified using custom made screens having their screen openings sized at 50 micrometers intervals i.e. at 300 micrometers, 350 micrometers, 400 micrometers, 450 micrometers, 500 micrometers etc. The −500 micrometers +450 micrometers diameter size fraction (34.7 g) was then used for the electroplating test.

The copper sphere build-up to an average size of 712±25 micrometers was carried out in an electroplating bath using particle agitation. Acid copper sulphate solution was used as the electrolyte. After the particle build-up of the −500 micrometers +450 micrometers fraction, the sphere size distribution was:

| Particle Diameter Fraction | Weight, grams | Distribution, % |
|---|---|---|
| +737 μm | 0.2 | 0.2 |
| −737 + 687 μm | 82.9 | 71.8 |
| −687 μm | 32.3 | 28.0 |
| Total | 115.4 | 100.0 |

The above results show that the recovery achieved for the electroplating build-up of the starting material to 712±25 micrometers was 72% but that the recovery could be improved to over 99% if the −687 micrometer fraction were separated and also built up by continued electroplating.

Figure 2:
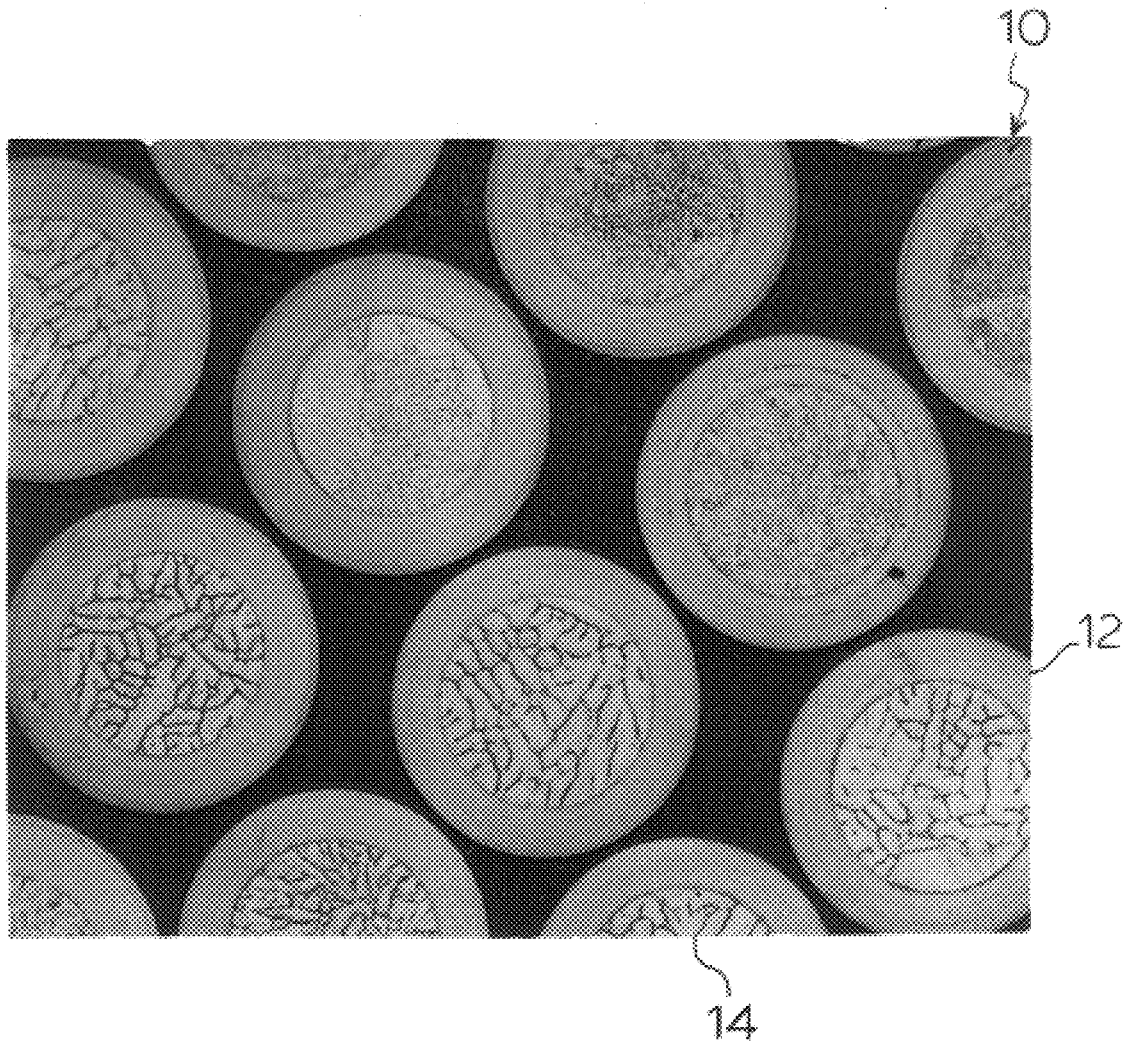
FIG. 2 is a photograph magnified 50 times of etched cross-sections of copper spheres produced by electroplating atomized copper spheres. All particles are in the 712±25 micrometer range. The soft atomized core and the hard electroplated cladding being clearly distinguished from each other.

FIG. 2 shows the final product, i.e. the copper spheres 10 in the 712±25 micrometer range. The average product sphericity, which is the ratio of sphere maximum diameter relative to sphere minimum diameter for the batch of the spheres produced, was 1.0197 and the standard deviation was 0.0087. This means that on average the difference between the maximum and minimum diameters was only 1.97%. The hard, fine-grain electroplated layer 12 was clearly revealed and distinguished from the soft, coarser grain core 14 by etching the metallographic cross section.

EXAMPLE 2

Tightly sized copper spheres having an average sphere diameter of 668 micrometers were electroplated with copper in the manner detailed in Example 1. The starting weight of the particles was 100 grams. No spheres were in the desired range of 712±25 micrometers. After 1.75 hours, the spheres were discharged from the electroplating cell. Their weight was 120.4 grams. Screening of the particles showed that 99.5% of the particles were in the desired range, i.e. 712±25 micrometers. The average diameter of the spheres was increased by 52 micrometers. Careful control of the build-up of the copper coating to the final size range of 712±25 micrometers was possible

EXAMPLE 3

Figure 3A:
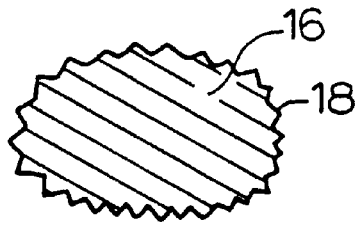
Figure 3C:
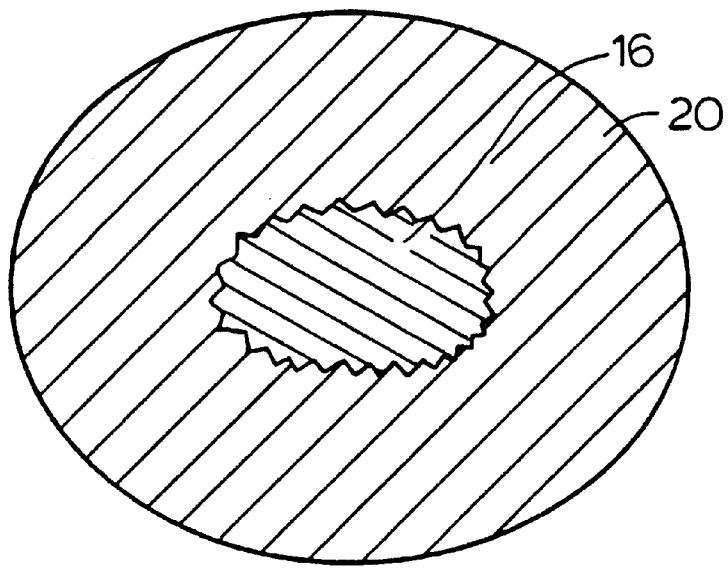
Figure 3C:
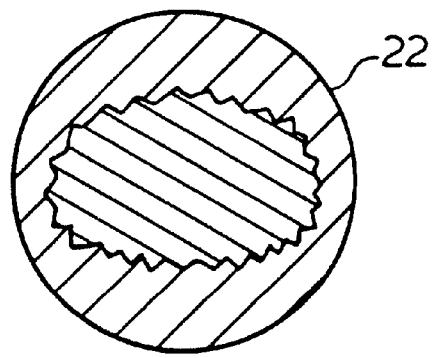

A highly spherical soft copper sphere can be produced from an irregular shaped copper particle 16 having a rough surface 18 as shown in FIG. 3A. The ball was electroplated with a layer of hard copper 20, as shown in FIG. 3B. This layer was then ground to a spherical shape 22 with the desired exact dimension, typified by FIG. 3C.

Figure 4A:
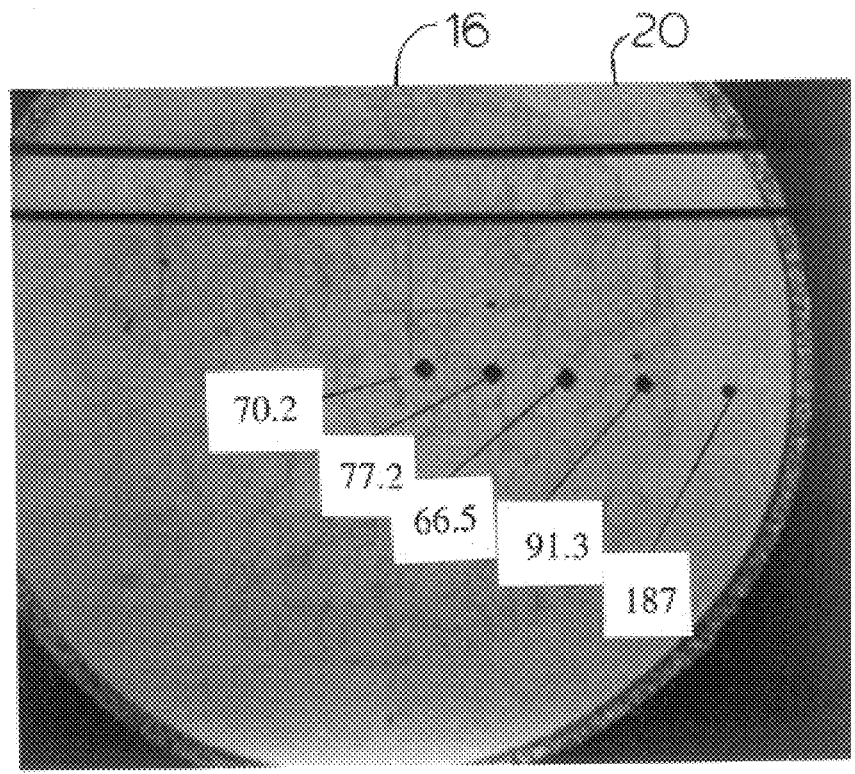
FIG. 4A is a photograph of an electroplated copper particle and FIG. 4B is a cross-hatched enhanced view of FIG. 4A, with a solder layer on the surface, FIG. 4A showing the difference in micro hardness Vickers Hardness (VH, 10 grams) between atomized and electroplated copper magnified approximately 150 times.
Figure 4B:
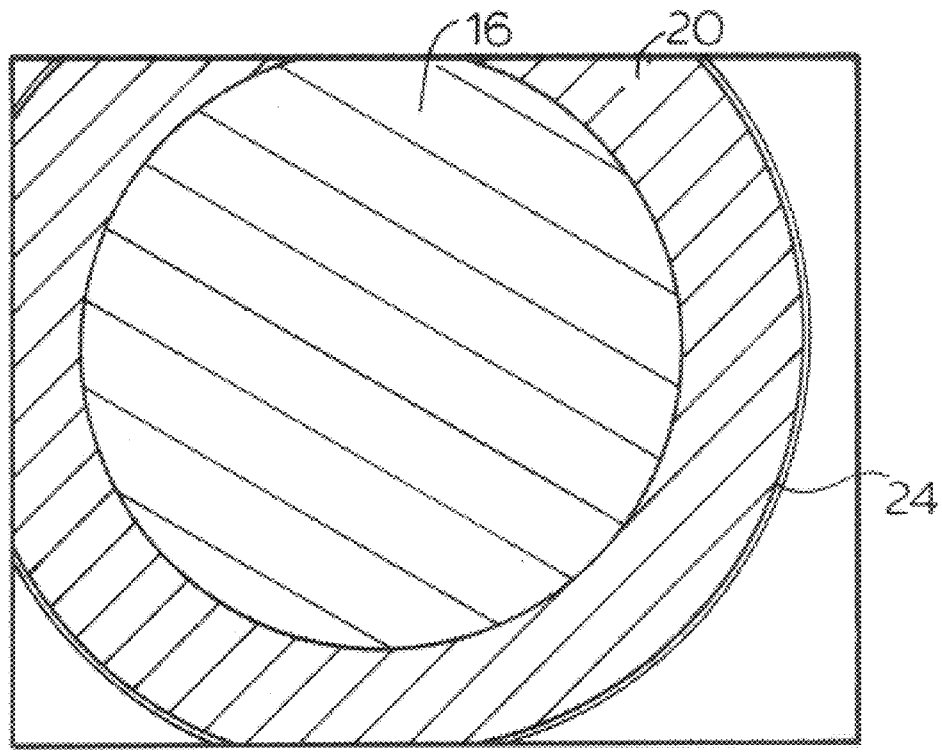

The grinding operation is highly simplified by the increased hardness of the electroplated layer. FIG. 4A indicates the substantial increase of hardness in the electroplate layer 20 relative to the core 16. FIG. 4B is a schematic representation of the electroplate copper 20 on the core 16. A layer of solder 24 is shown on the surface of the copper electroplate 20. The following hardness values were measured:

Atomized copper: VH (10 grams load) (17 measurements taken on 4 particles) Average=79 Standard deviation=11.0
Electroplated copper: VH (10 grams load) (5 measurements taken on 4 particles) Average=195 Standard deviation=8.4

EXAMPLE 4

Figure 5A:
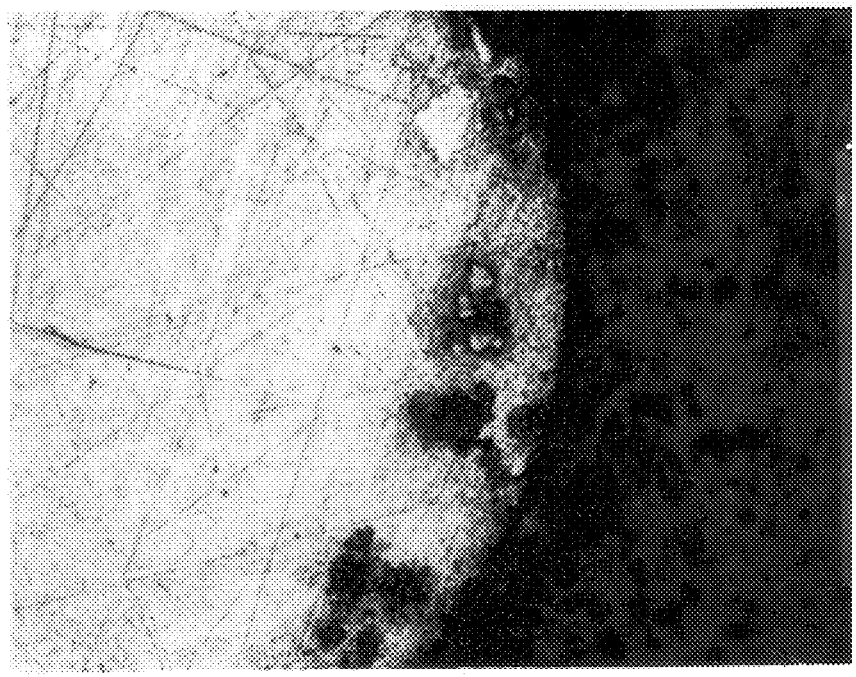
FIGS. 5A and 5B illustrate grinding grit contamination due to embedded grinding media in the soft core, FIG. 5A being a photograph of a cross-section portion of a sphere and FIG. 5B being a drawing thereof.
Figure 5B:
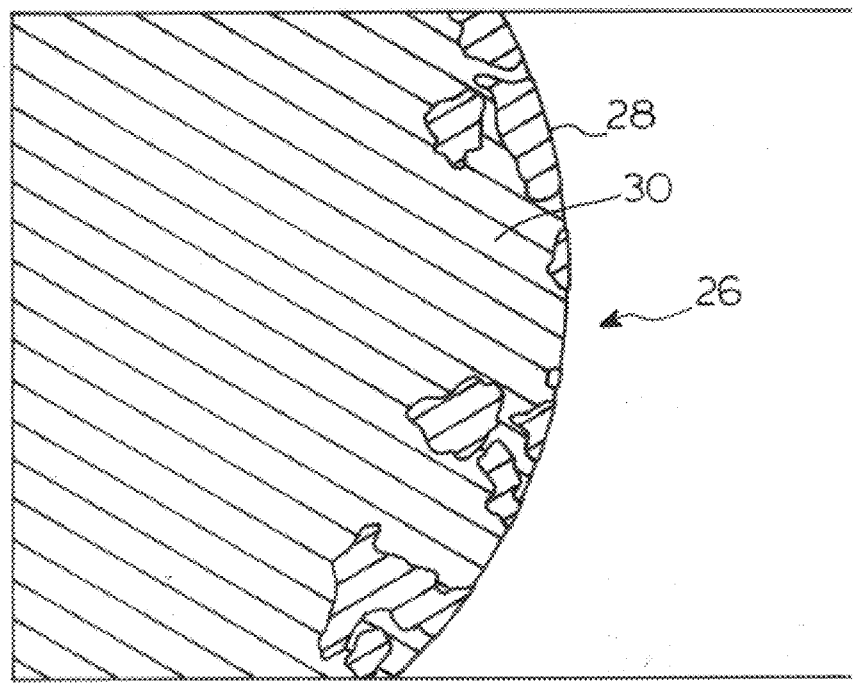

Grinding of soft copper balls resulted in the surface contamination of the balls 26 by the hard grinding media particles 28 which became embedded in the soft copper material 30. FIGS. 5A and 5B show subsequent unsatisfactory product due to contamination at the sphere surface.

Figure 6A:
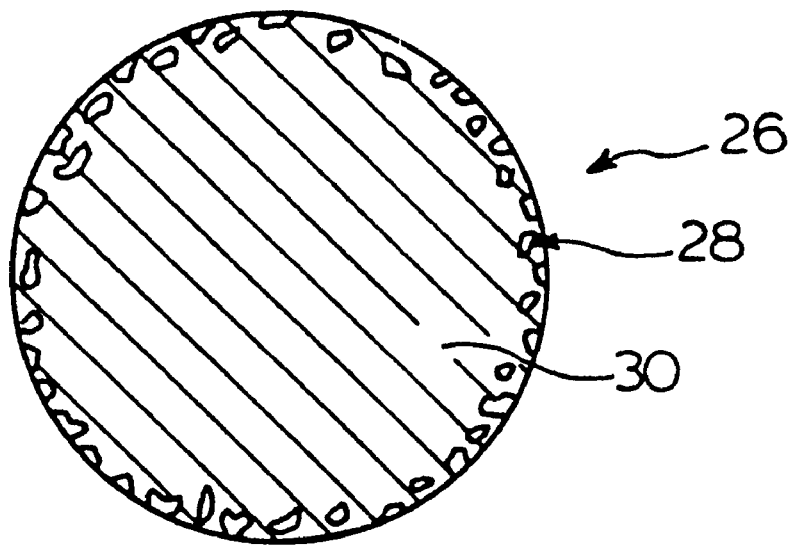
FIGS. 6A and 6B illustrate electroplating of copper spheres contaminated on the surface thereof.
Figure 6B:
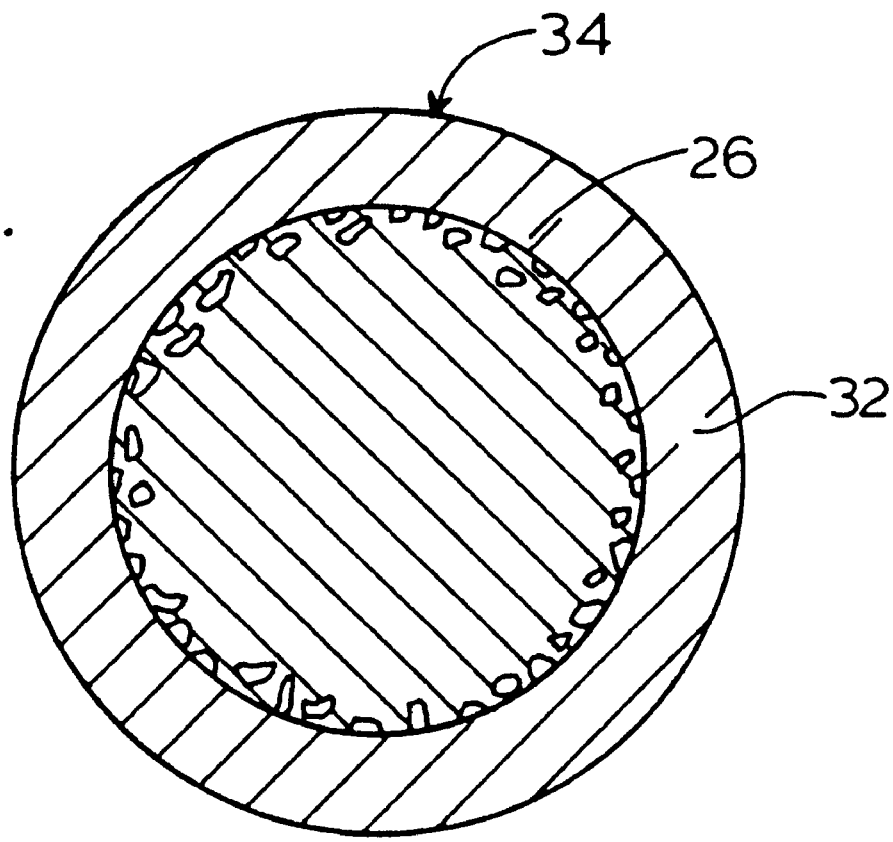

The problem can be solved by grinding the balls 26 to a smaller diameter than required as shown in FIG. 6A, and then building up the sphere diameter to the required size, as shown in FIG. 6B, by electroplating a copper layer 32. The electroplated surface 34 is clean and without contamination (FIGS. 6B, 7A and 7B).

It will be understood that changes and modifications may be made in the embodiments of the invention without departing from the scope and purview of the appended claims.

We claim:

1. A method for the manufacture of accuratey sized metal spheres having the desired degree of sphericity and having approximately the same final mean diameter and final diameter distribution comprising the steps of classifying substantially spherical starting metal particles having a wide diameter size range distribution into different narrow diameter size range fractions, and separately electroplating each of said different size range fractions smaller than a desired final mean diameter with a metal or metal alloy such that each of said electroplated fractions is substantially spherical and has the desired degree of sphericity and approximately the same final mean diameter and final diameter distribution.

2. A method as claimed in claim 1, wherein the electroplated fractions are combined to give a product with the required final mean diameter and diameter distribution.

3. A method as claimed in claim 2, wherein the starting metal particles have an irregular shape, conducting the electroplating stage thereof to produce oversized particles and polishing the particles to give the desired degree of sphericity, the final mean diameter and diameter distribution.

4. A method as claimed in claim 1, wherein one or more of the classified size fractions of the starting metal particles contains particles with an irregular shape, coducting the electroplating stage thereof to produce one or more size fractions having particles of a size greater than the desired final mean diameter, and polishing the oversized particles down to the desired final mean diameter to give the desired degree of sphericty, the final mean diameter and diameter distribution.

5. A method as claimed in claim 1, wherein one or more of the classified fractions of the starting metal particles contains particles with contaminated surfaces, conducting the electroplating stage thereof with the metal or metal alloy to envelop said contaminated surfaces and to provide product metal spheres having uncontaminated surfaces.

6. A method as claimed in claim 6, wherein the starting metal particles contain said contaminated surfaces from grinding of said particles of irregular shape before said electroplating.

7. A method as claimed in claim 1, 2, 3, or 5, in which the starting metal particles are lead-tin based and the electroplated metal alloy is lead-tin based.

\* \* \* \* \*